United States Patent
Burg et al.

(10) Patent No.: US 8,957,713 B2
(45) Date of Patent: *Feb. 17, 2015

(54) METHODS AND DEVICES FOR MULTIPLE-MODE RADIO FREQUENCY SYNTHESIZERS

(71) Applicant: Marvell World Trade Ltd., St. Michael (BB)

(72) Inventors: Olivier Burg, Lausanne (CH); Cao-Thong Tu, Preverenges (CH)

(73) Assignee: Marvell World Trade Ltd., St. Michael (BB)

(*) Notice: Subject to any disclaimer, the term of this patent is extended or adjusted under 35 U.S.C. 154(b) by 0 days.

This patent is subject to a terminal disclaimer.

(21) Appl. No.: 14/244,710

(22) Filed: Apr. 3, 2014

(65) Prior Publication Data
US 2014/0218086 A1 Aug. 7, 2014

Related U.S. Application Data

(63) Continuation of application No. 13/406,246, filed on Feb. 27, 2012, now Pat. No. 8,710,884.

(60) Provisional application No. 61/447,369, filed on Feb. 28, 2011.

(51) Int. Cl.
| | |
|---|---|
| *H03L 7/06* | (2006.01) |
| *H03L 7/099* | (2006.01) |
| *H03L 7/113* | (2006.01) |
| *H03L 7/16* | (2006.01) |

(52) U.S. Cl.
CPC ............ *H03L 7/0991* (2013.01); *H03L 7/113* (2013.01); *H03L 7/16* (2013.01); *H03L 2207/50* (2013.01)

USPC ............ 327/159; 327/150; 327/152; 327/147

(58) Field of Classification Search
USPC ...................... 327/141, 144–163; 331/15–17; 375/373–376
See application file for complete search history.

(56) References Cited

U.S. PATENT DOCUMENTS

| | | | |
|---|---|---|---|
| 6,097,777 A * | 8/2000 | Tateishi et al. | 375/376 |
| 6,307,413 B1 | 10/2001 | Dalmia et al. | |
| 6,310,521 B1 | 10/2001 | Dalmia | |
| 6,683,930 B1 | 1/2004 | Dalmia | |
| 6,867,627 B1 | 3/2005 | Murtagh | |
| 6,949,981 B2 | 9/2005 | Natonio et al. | |

(Continued)

FOREIGN PATENT DOCUMENTS

WO WO 2010/113108 10/2010

*Primary Examiner* — Brandon S Cole (57) ABSTRACT

Methods and devices provide for determining whether to operate a radio frequency synthesizer in a first mode of operation or a second mode of operation based on a reference frequency signal. The radio frequency synthesizer includes a digitally-controlled oscillator configured to generate an oscillator signal having an output frequency. A digital frequency locked-loop is configured to control the output frequency of the oscillator signal in a first mode of operation based on a first control signal. A digital phase locked-loop is configured to control the output frequency of the oscillator signal in a second mode of operation based on a second control signal. A controller determines whether to operate in the first mode or second mode based on a reference frequency signal. The controller generates the first or second control signal based on the determination of operating in the first or second mode, respectively.

18 Claims, 5 Drawing Sheets

(56) References Cited

U.S. PATENT DOCUMENTS

| | | |
|---|---|---|
| 6,987,406 B1 | 1/2006 | Chiu |
| 7,009,456 B2 | 3/2006 | Jasa et al. |
| 7,463,100 B2 | 12/2008 | Kim et al. |
| 7,616,069 B2 | 11/2009 | Li |
| 7,750,685 B1 | 7/2010 | Bunch et al. |
| 8,165,258 B2 | 4/2012 | Weng et al. |
| 2002/0037065 A1 | 3/2002 | Nakamura |
| 2005/0030001 A1 | 2/2005 | Jasa et al. |

\* cited by examiner

METHODS AND DEVICES FOR MULTIPLE-MODE RADIO FREQUENCY SYNTHESIZERS

CROSS REFERENCE TO RELATED APPLICATIONS

This patent application is a continuation of U.S. patent application Ser. No. 13/406,246, filed Feb. 27, 2012, currently pending, which claims the benefit of U.S. Provisional Patent App. No. 61/447,369 for "Methods and Devices for Implementing All-Digital Phase Locked Loop" filed Feb. 28, 2011, the disclosures of which are each hereby incorporated by reference herein in their entireties.

BACKGROUND

Particular embodiments generally relate to multiple-mode radio frequency synthesizers.

Unless otherwise indicated herein, the approaches described in this section are not prior art to the claims in this application and are not admitted to be prior art by inclusion in this section.

Various radio frequency synthesizers are known for use in various devices, such as transceivers. The radio frequency synthesizer generates a local oscillator frequency signal for a carrier. The radio frequency synthesizer may include a phase lock loop for generating the local oscillator frequency signal.

SUMMARY

Embodiments include circuits and methods of multimode radio frequency synthesis. In one embodiment, a circuit comprises a digitally-controlled oscillator, a digital frequency locked-loop, a digital phase locked-loop and a controller. The digitally-controlled oscillator is configured to generate an oscillator signal having an output frequency. The digital frequency locked-loop is configured to control the output frequency of the oscillator signal in a first mode of operation based on a first control signal. The digital phase locked-loop is configured to control the output frequency of the oscillator signal in a second mode of operation based on a second control signal. The controller is configured to determine whether to operate in the first mode or second mode of operation based on a reference frequency signal, generate the first control signal based on the determination of operating in the first mode of operation, and generate the second control signal based on the determination of operating in the second mode of operation.

In one embodiment, the controller is further configured to select the first mode of operation if the reference frequency signal is below a threshold, and select the second mode of operation if the reference frequency signal is above the first threshold.

In one embodiment, the digital frequency locked-loop is further configured to control the output frequency of the oscillator signal in the first mode of operation based on the output frequency and the reference frequency signal.

In one embodiment, the digital phase locked-loop is further configured to control the output frequency of the oscillator signal in the second mode of operation based on the output frequency and the reference frequency signal.

In one embodiment, a calibration loop is configured to control the output frequency of the oscillator signal in a startup mode of operation, the startup mode being before the first mode of operation and the second mode of operation.

In one embodiment, the calibration loop is further configured to control the output frequency of the oscillator signal in the startup mode of operation based on the output frequency and the and the reference frequency signal.

In one embodiment, the calibration loop is further configured to control the output frequency of the oscillator signal to be within a selected range of the selected output frequency.

In one embodiment, the controller is further configured to switch between the determined mode of operation and another mode of operation, disable the enabled locked-loop, and enable the other loop.

In one embodiment, the controller is further configured to provide a signal indicative of a recent frequency command from the previously enabled loop prior to switching.

In one embodiment, a method comprises determining whether to operate in a first mode or second mode of operation based on a reference frequency signal. A digital frequency locked-loop is enabled to control an output frequency of a digitally-controlled oscillator based on the determination of operating in the first mode of operation. A digital phase locked-loop is enabled to control the output frequency of the digitally-controlled oscillator based on the determination of operating in the second mode of operation.

In one embodiment, determining whether to operate in a first mode or second mode of operation based on a reference frequency signal comprises selecting the first mode of operation if the selected output frequency is below a threshold, and selecting the second mode of operation if the selected output frequency is above the threshold.

In one embodiment, the digital frequency locked-loop further controls the output frequency of the digitally-controlled oscillator in the first mode of operation based on the output frequency of the digitally-controlled oscillator and the reference frequency signal.

In one embodiment, the digital phase locked-loop further controls the output frequency of the digitally-controlled oscillator in the second mode of operation based on the output frequency of the digitally-controlled oscillator and the reference frequency signal.

In one embodiment, a calibration loop is enabled to control the output frequency of the digitally-controlled oscillator in a startup mode of operation. The startup mode is before the first mode of operation and the second mode of operation.

In one embodiment, the calibration loop further controls the output frequency of the digitally-controlled oscillator in the startup mode of operation based on the output frequency of the digitally-controlled oscillator and the reference frequency signal.

In one embodiment, the calibration loop adjusts the output frequency of the digitally-controlled oscillator to be within a selected range of the selected output frequency.

In one embodiment, the method further comprises switching between the determined mode of operation and another mode of operation, disabling the enabled locked-loop, and enabling the other locked-loop.

In one embodiment, the method further comprises providing a signal indicative of a recent frequency command from the previously enabled locked-loop prior to switching.

The following detailed description and accompanying drawings provide a better understanding of the nature and advantages of the embodiments described herein.

DETAILED DESCRIPTION

Described herein are techniques for methods and devices for multiple-mode radio frequency synthesizers. In the following description, for purposes of explanation, numerous examples and specific details are set forth in order to provide a thorough understanding of the disclosure. It will be evident, however, to one skilled in the art that the present invention as defined by the claims may include some or all of the features in these examples alone or in combination with other features described below, and may further include modifications and equivalents of the features and concepts described herein.

Figure 1:
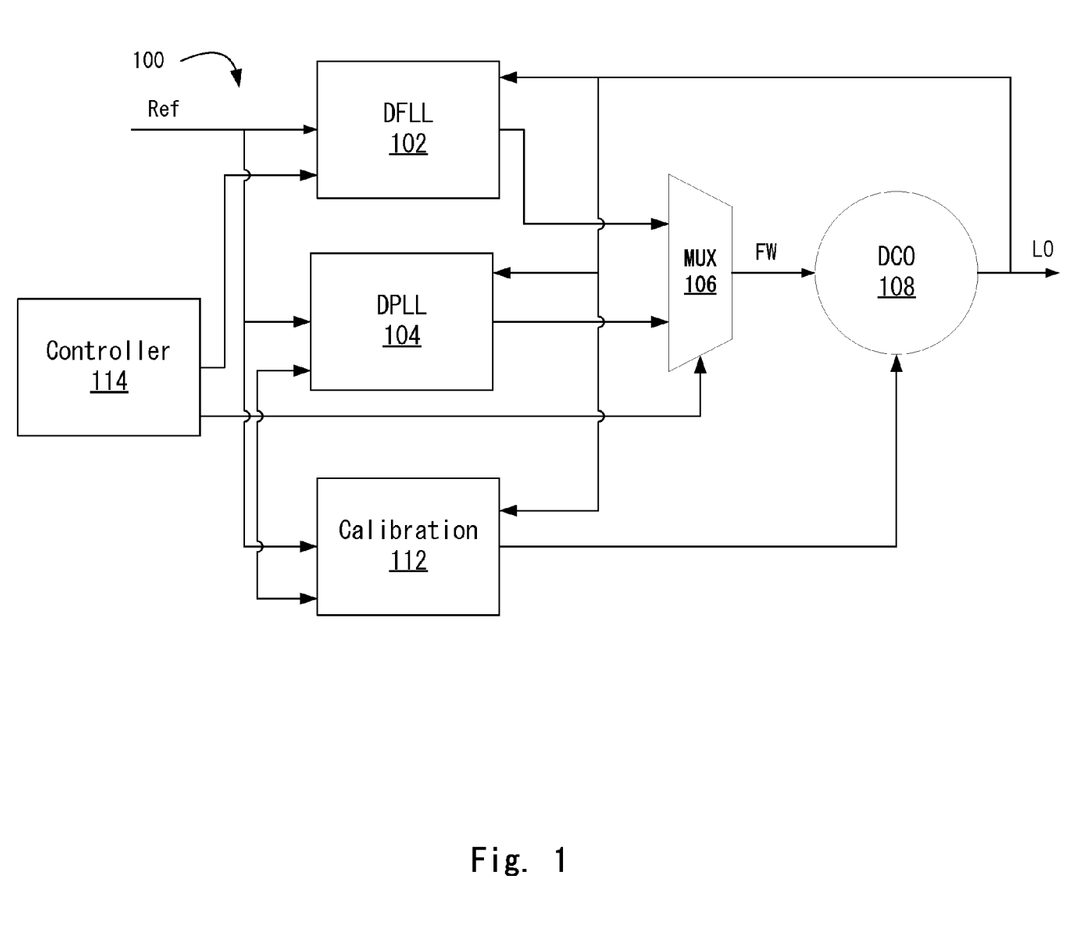
FIG. 1 illustrates a multiple mode radio frequency synthesizer according to one embodiment.

FIG. 1 illustrates a multiple mode radio frequency synthesizer 100 according to one embodiment. Radio frequency synthesizer 100 generates a Local Oscillator (LO) frequency signal at a selected frequency in response to a reference (REF) signal from an external source (not shown), such as a crystal oscillator. In some embodiments, radio frequency synthesizer 100 comprises a plurality of feedback loops that determines the time or phase difference between the REF signal and feedback of the LO frequency signal to generate the LO frequency signal. Radio frequency synthesizer 100 is a radio frequency synthesizer that has an architecture that combines a plurality of feedback loops, such as a digital frequency locked-loop (DFLL) 102 and a digital phase locked-loop (DPLL) 104, to provide complementary modes of operation.

The feedback loops of radio frequency synthesizer 100 continuously monitor the LO frequency signal from DCO 108 and perform fine adjustment of the LO frequency signal to track the frequency of the REF signal. The frequency $F_{LO}$ of the LO frequency signal is a multiple N of the reference clock frequency $F_{REF}$ of the REF signal:

$$F_{LO}=N \times F_{REF},$$

where N can be a real number.

In some embodiments, the frequency $F_{LO}$ of the LO frequency signal is in the range of 1.1 to 1.5 GHz.

Radio frequency synthesizer 100 further comprises a multiplexer 106, a digitally-controlled oscillator (DCO) 108, a calibration loop 112, and a controller 114. DCO 108 provides the Local Oscillator (LO) frequency signal that has a frequency $F_{LO}$ that is set by a digital frequency select control word (FW) signal from multiplexer 106. Controller 114 provides a selection signal to multiplexer 106 to control whether multiplexer 106 provides the FW signal from DFLL 102 or DPLL 104.

Radio frequency synthesizer 100 may operate in a digital frequency locked-loop (DFLL) mode in which DFLL 102 controls the frequency $F_{LO}$ of the LO frequency signal. In some embodiments, controller 114 selects the mode of operation, such as the DFLL mode or the DPLL mode, based on the reference clock frequency $F_{REF}$ of the REF signal. Controller 114 may select the mode of operation based on whether the reference clock frequency $F_{REF}$ of the REF signal exceeds a frequency threshold. In some embodiments, controller 114 selects the DFLL mode if the frequency $F_{REF}$ of the REF signal is low (e.g., 32 kHz). Radio frequency synthesizer 100 may operate in a digital phase locked-loop (DPLL) mode in which the DPLL 104 controls the frequency of the LO frequency signal. In some embodiments, controller 114 selects the DPLL mode for higher-frequency reference clocks (e.g., frequencies above 1 MHz).

In a calibration mode, calibration loop 112 provides a coarse frequency control signal to DCO 108 at the startup of radio frequency synthesizer 100 by measuring and adjusting the frequency $F_{LO}$ of the LO frequency signal from DCO 108. Calibration loop 112 may provide the coarse frequency control signal to multiplexer 106 for selective application to DCO 108. Although the calibration mode is described as being performed before the DFLL mode and the DPLL mode, the calibration mode may be performed at other times, such as when a feedback loop loses lock.

While switching between modes, the currently enabled loop of DFLL 102 and DPLL 104 may provide the loop that is to next be enabled with the last value of the FW signal in the currently enabled mode. The next to be enabled loop of DFLL 102 and DPLL 104 may use the FW signal to calculate the next frequency control FW in the next mode of operation. This may minimize the transient frequency error of the LO frequency signal while switching modes. Similarly, while switching between the calibration mode and DFLL mode or DPLL mode, calibration loop 112 may provide the coarse frequency control signal to the enabled loop of DFLL 102 and DPLL.

Figure 2:
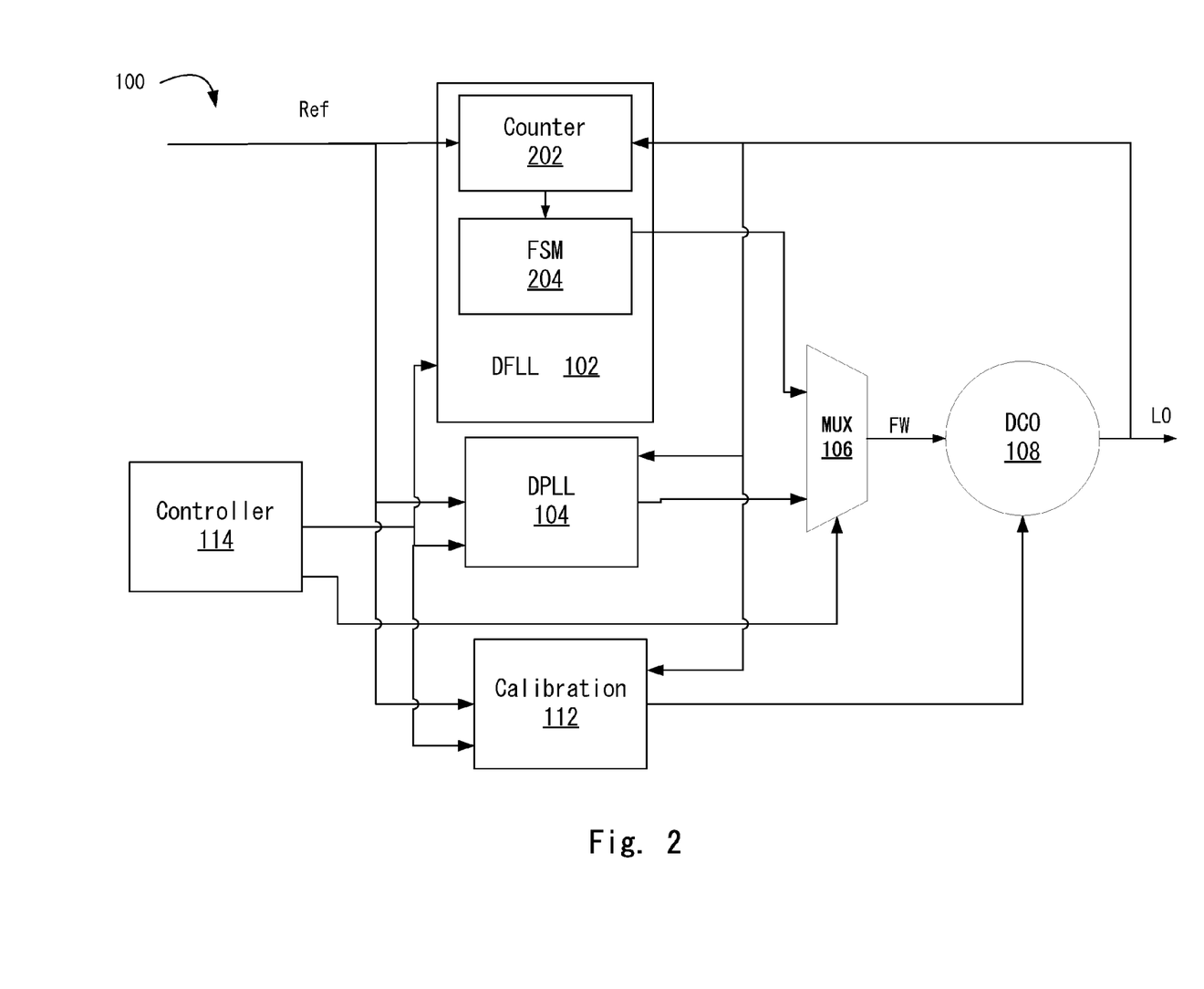
FIG. 2 illustrates the multiple mode radio frequency synthesizer of FIG. 1 operating in a digital frequency locked-loop mode.

FIG. 2 illustrates radio frequency synthesizer 100 operating in a digital frequency locked-loop mode. DFLL 102 comprises a counter 202 and a finite state machine (FSM) 204. Counter 202 monitors the LO frequency signal at a low rate. In some embodiments, counter 202 is a high resolution counter. FSM 204 includes an algorithm for incrementing or decrementing the FW signal in response to the difference between the frequency of the LO frequency signal and a target frequency $F_{LOT}$. When the frequency $F_{LO}$ of the LO frequency signal drifts away from the target frequency $F_{LOT}$ beyond a specified limit, FSM 204 adjusts the frequency back in the specified limit by changing the FW signal.

In some embodiments, the frequency $F_{LO}$ of the LO frequency signal tracks the frequency $F_{REF}$ of the REF signal with a precision in the order of 100 parts per million.

Particular embodiments of DFLL 102 may provide many advantages. In the DFLL mode, DCO 108 may be free-running when the frequency $F_{LO}$ of the LO frequency signal is within the specified boundaries around the target frequency $F_{LOT}$ and the feedback operates in a non-linear manner to thereby provide no amplification of the reference noise.

Figure 3:
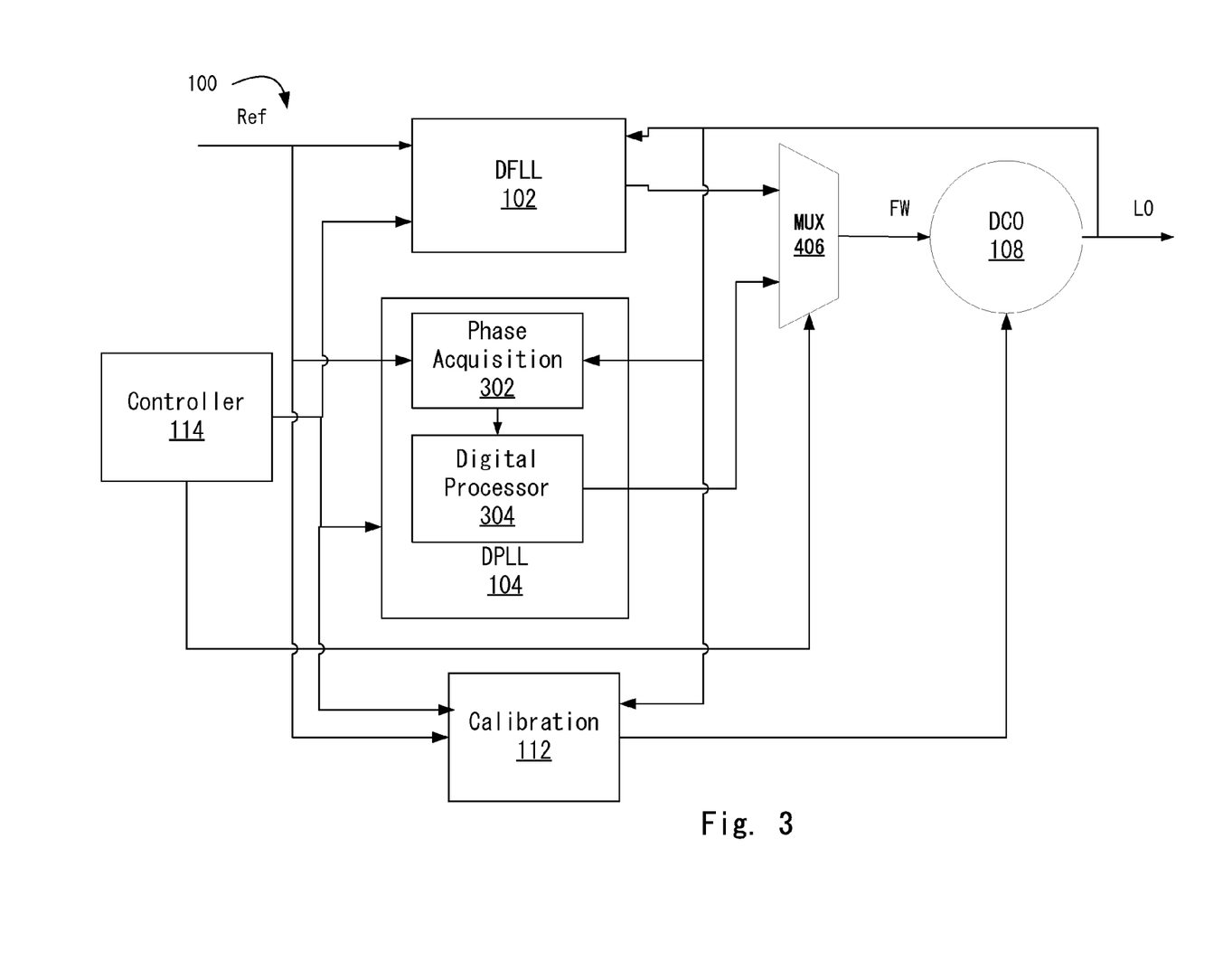
FIG. 3 illustrates the multiple mode radio frequency synthesizer of FIG. 1 operating in a digital phase locked-loop mode.

FIG. 3 illustrates radio frequency synthesizer 100 operating in a digital phase locked-loop mode. DPLL 104 comprises a phase acquisition circuit 302 and a digital processor 304. Phase acquisition circuit 302 monitors the phase error between the LO frequency signal and the REF signal at the reference clock rate. Digital processor 304 performs signal processing, such as filtering and time-to-digital conversion, to generate a correction, which is proportional to the phase error. The correction is applied to DCO 108 as the FW signal to cancel the phase error. When the frequency $F_{LO}$ of the LO frequency signal drifts away from the target frequency $F_{LOT}$, digital processor 304 adjusts the frequency $F_{LO}$ back to the target frequency $F_{LOT}$ by changing the FW signal. In DPLL mode (unlike in DFLL mode), radio frequency synthesizer 100 behaves as a linear feedback system. DPLL 104 continuously applies a correction related to a difference frequency $F_{LO}-F_{LOT}$ (the difference between the frequency $F_{LO}$ and the target frequency $F_{LOT}$). DPLL 104 does not wait until the difference frequency $F_{LO}$-$F_{LOT}$ goes beyond a specified limit. At every instant, the magnitude of the correction applied is related to the difference frequency $F_{FO}$-$F_{LOT}$. This allows a tight control on the frequency $F_{LO}$ (e.g., 1 part per million).

In some embodiments, the frequency $F_{LO}$ of the LO frequency signal tracks the frequency $F_{REF}$ of the REF signal with a precision in the order of 1 part per million.

In some embodiments, phase acquisition circuit 302 comprises an RF counter (not shown) to increment at each clock cycle of the REF signal to provide coarse phase information as integer multiples of the period of the LO frequency signal. Phase acquisition circuit 302 also may comprises a time to digital converter (not shown) to measure the phase of the LO frequency signal at the clock rate of the REF signal. The time to digital converter provides fine phase information as a fraction of the oscillator period of the LO frequency signal to digital processor 304. The fine phase information may improve the phase noise performance of radio frequency synthesizer 100. Digital processor 304 processes the phase to lock the frequency $F_{LO}$ of the LO frequency signal on a multiple of the frequency of the REF signal.

Particular embodiments of DPLL 104 may provide many advantages. For example, the fast response of the feedback loop may make radio frequency synthesizer 100 more immune to external perturbations. Further, the linear behavior may allow cancellation of the DCO flicker noise for better noise performance.

Figure 4:
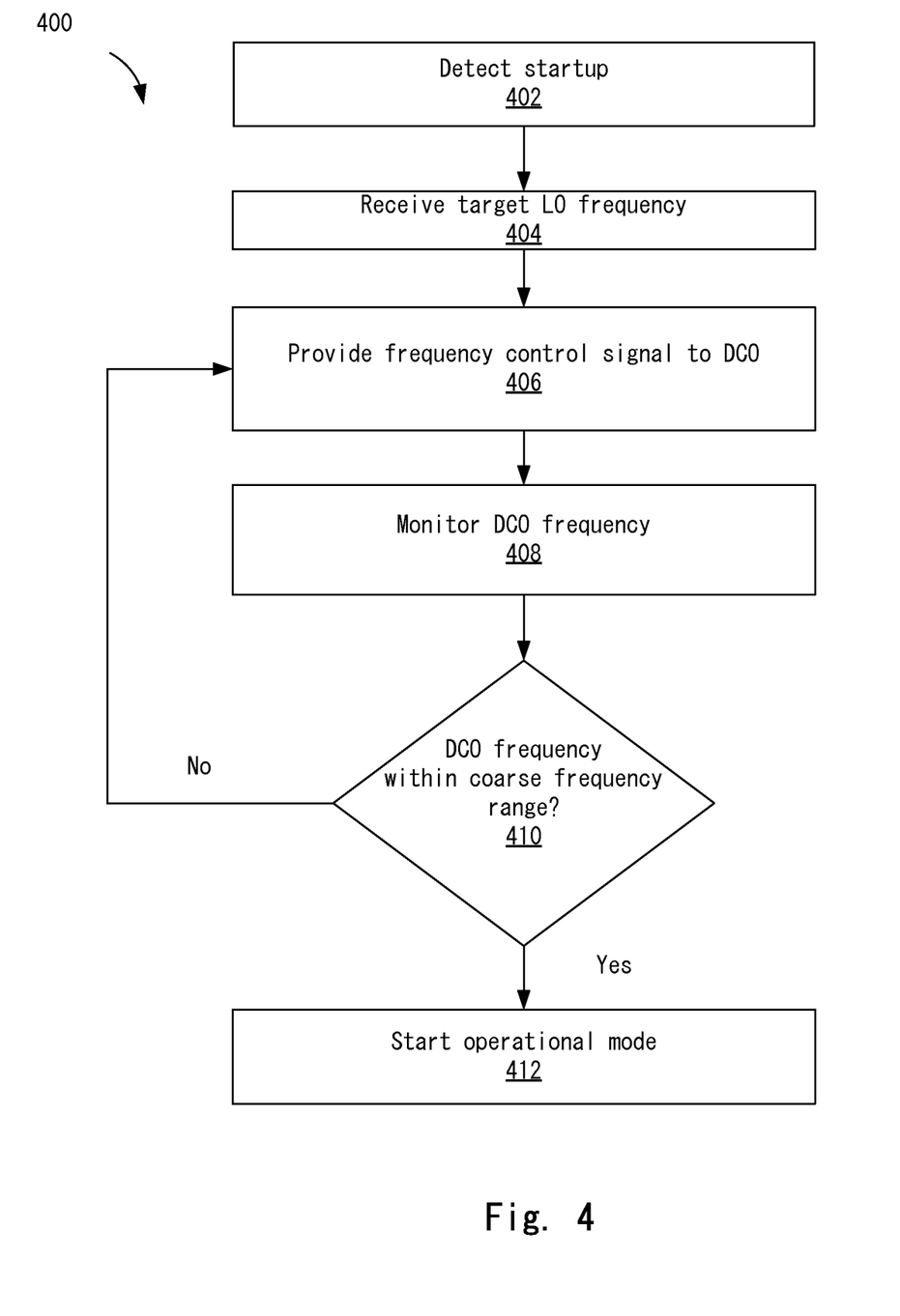
FIG. 4 illustrates a simplified flowchart of a method for a calibration mode according to one embodiment.

FIG. 4 illustrates a simplified flowchart of a method for a calibration mode according to one embodiment. At 402, a startup of radio frequency synthesizer 100 is detected. At 404, a target LO frequency $F_{LOT}$ is received by controller 114. At 406, a frequency control signal is provided to DCO 108 by calibration loop 112 based on a comparison of the frequency $F_{LO}$ of the LO frequency signal to the frequency $F_{REF}$ of the REF signal. At 408, the frequency $F_{LO}$ of the LO frequency signal from DCO 108 is monitored by calibration loop 112. At 410, a determination is made by calibration loop 112 whether the frequency $F_{LO}$ of the LO frequency signal from DCO 108 is within a coarse frequency range based on the target LO frequency $F_{LOT}$. At 412, the operational mode of either DFLL or DPLL is started and controlled by controller 114, if the frequency $F_{LO}$ of the LO frequency signal from DCO 108 is within a coarse frequency range. Otherwise, if the frequency $F_{LO}$ of the LO frequency signal from DCO 108 is not within a coarse frequency range, the frequency control signal is provided to DCO 108 by calibration loop 112 at 406.

Figure 5:
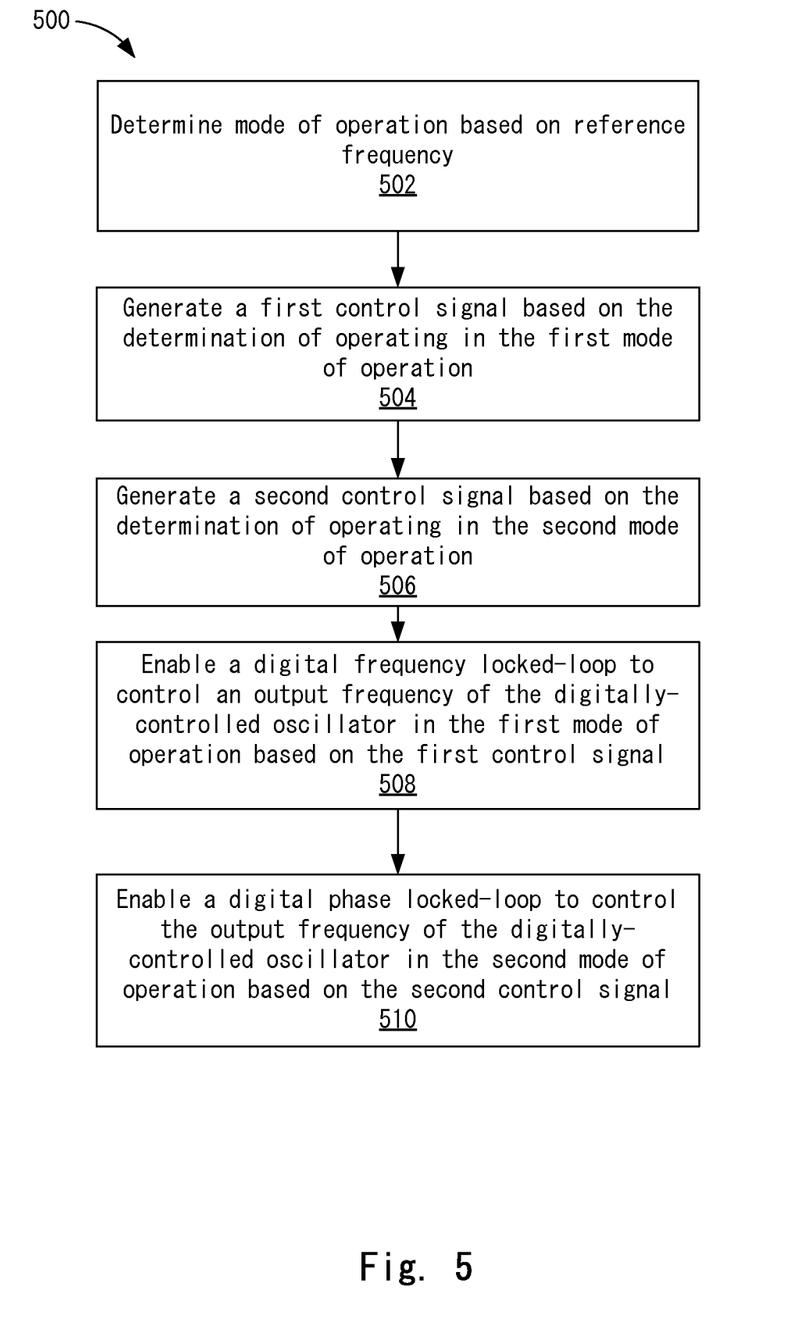
FIG. 5 illustrates a simplified flowchart of a method for operating the multiple mode radio frequency synthesizer of FIG. 1 according to one embodiment.

FIG. 5 illustrates a simplified flowchart of a method for operating the radio frequency synthesizer according to one embodiment. At 502, a determination is made by controller 114 whether to operate radio frequency synthesizer 100 in a first mode (e.g., DFLL mode) or second mode (e.g., DPLL mode) of operation based on frequency $F_{REF}$ of the REF signal. In some embodiments, the first mode of operation is selected if the frequency $F_{REF}$ of the REF signal is below a threshold, and the second mode of operation is selected if the frequency $F_{REF}$ of the REF signal is above the threshold. At 504, a first control signal is generated based on the determination of operating in the first mode of operation. At 506, a second control signal is generated based on the determination of operating in the second mode of operation. At 508, DFLL 102 is enabled to control frequency $F_{LO}$ of the LO frequency signal of DCO 108 based on and the first control signal. At 510, DPLL 104 is enabled to control the output frequency of DCO 108 based on the second control signal.

Particular embodiments provide many advantages. Radio frequency synthesizer 100 may switch between the DFLL and the DPLL modes on the fly without turning off DCO 108 in a fast and relatively smooth transition, so that the switching is unnoticeable on the LO frequency signal at the output of radio frequency synthesizer 100.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, one or more steps of methods or processes discussed above may be performed in a different order (or concurrently) and still achieve desirable results. Based on the above disclosure and the following claims, other arrangements, embodiments, implementations and equivalents may be employed without departing from the scope of the invention as defined by the claims.

What is claimed is:

1. A method comprising:
   determining whether to operate in a first mode or second mode of operation based on whether a reference frequency value of a reference frequency signal exceeds a threshold, wherein a third mode of operation has less precision than either the first mode of operation or the second mode of operation, and wherein the third mode of operation enables a calibration loop to control an output frequency of the oscillator; and
   allowing a digital phase locked-loop to control the output frequency of the oscillator when determining to operate in the second mode, and
   allowing a digital frequency locked-loop to control the output frequency of the oscillator when determining to operate in the first mode.

2. The method of claim 1, wherein determining whether to operate in a first mode or second mode of operation comprises:
   selecting the first mode of operation if the reference frequency value is below the threshold; and
   selecting the second mode of operation if the reference frequency value is above the threshold.

3. The method of claim 1, wherein the digital frequency locked-loop further controls the output frequency of the oscillator in the first mode of operation based on the output frequency of the oscillator and the reference frequency value of the reference frequency signal.

4. The method of claim 1, wherein the digital phase locked-loop further controls the output frequency of the oscillator in the second mode of operation based on the output frequency of the oscillator and the reference frequency value of the reference frequency signal.

5. The method of claim 1, wherein the third mode of operation includes allowing a calibration loop to control the output frequency of the oscillator, the third mode being after the first mode of operation and the second mode of operation.

6. The method of claim 5, wherein the calibration loop further controls the output frequency of the oscillator in the third mode of operation based on the output frequency of the oscillator and the reference frequency signal.

7. The method of claim 5, wherein the calibration loop adjusts the output frequency of the oscillator to be within a selected range of a selected output frequency.

8. The method of claim 1, further comprising:
switching between the determined mode of operation and another mode of operation;
disabling the enabled locked-loop; and
enabling the other locked-loop.

9. The method of claim 8, further comprising providing a signal indicative of a recent frequency command from the previously enabled locked-loop prior to switching.

10. A circuit comprising:
an oscillator configured to generate an oscillator signal having an output frequency;
a digital frequency locked-loop configured to control the output frequency of the oscillator in a first mode of operation based on a first control signal;
a digital phase locked-loop configured to control the output frequency of the oscillator signal in a second mode of operation based on a second control signal; and
a controller configured to:
use a third mode of operation that has less precision than either the first mode of operation or the second mode of operation, wherein the third mode of operation enables a calibration loop to control an output frequency of the oscillator;
determine whether to operate in the second mode of operation based on whether a reference frequency value of a reference frequency signal exceeds a threshold; and
generate the second control signal based on the determination of operating in the second mode of operation, and generate the first control signal based on the determination of operating in the first mode of operation.

11. The circuit of claim 10, wherein the controller is further configured to:
select the first mode of operation if the reference frequency value is below the threshold; and
select the second mode of operation if the reference frequency value is above the threshold.

12. The circuit of claim 10, wherein the digital frequency locked-loop is further configured to control the output frequency of the oscillator signal in the first mode of operation based on the output frequency and the reference frequency value of the reference frequency signal.

13. The circuit of claim 10, wherein the digital phase locked-loop is further configured to control the output frequency of the oscillator signal in the first mode of operation based on the output frequency and the reference frequency value of the reference frequency signal.

14. The circuit of claim 10, wherein in the third mode of operation a calibration loop is configured to control the output frequency of the oscillator signal, the third mode of operation being after the first mode of operation and the second mode of operation.

15. The circuit of claim 14, wherein the calibration loop is further configured to control the output frequency of the oscillator signal in the third mode of operation based on the output frequency and the reference frequency value of the reference frequency signal.

16. The circuit of claim 14, wherein the calibration loop is further configured to control output frequency of the oscillator signal to be within a selected range of a selected output frequency.

17. The circuit of claim 10, wherein the controller is further configured to
switch between the determined mode of operation and another mode of operation;
disable the enabled locked-loop; and
enable the other locked-loop.

18. The circuit of claim 17, wherein the controller is further configured to provide a signal indicative of a recent frequency command from the previously enabled loop prior to switching.

* * * * *